(12) United States Patent
Jin et al.

(10) Patent No.: US 10,475,969 B2
(45) Date of Patent: Nov. 12, 2019

(54) COLOR CONVERTER HAVING A PLURALITY OF SPACED A PART WAVELENGTH CONVERSION LAYERS

(71) Applicant: Samsung Display Co., Ltd., Yongin-si, Gyeonggi-do (KR)

(72) Inventors: You Young Jin, Suwon-si (KR); Jang Soo Kim, Asan-si (KR); Jae Cheol Park, Hwaseong-si (KR); Wang Su Hong, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/912,811

(22) Filed: Mar. 6, 2018

(65) Prior Publication Data

US 2019/0088834 A1    Mar. 21, 2019

(30) Foreign Application Priority Data

Sep. 18, 2017  (KR) .......................... 10-2017-0119786

(51) Int. Cl.
*H01L 33/50*    (2010.01)
*H01L 33/46*    (2010.01)
*H01L 27/32*    (2006.01)

(52) U.S. Cl.
CPC .......... *H01L 33/505* (2013.01); *H01L 27/322* (2013.01); *H01L 33/46* (2013.01); *H01L 33/507* (2013.01); *H01L 33/504* (2013.01); *H01L 2933/0041* (2013.01); *H01L 2933/0091* (2013.01)

(58) Field of Classification Search
CPC ...... H01L 33/505; H01L 33/46; H01L 33/507
See application file for complete search history.

(56) References Cited

U.S. PATENT DOCUMENTS

| | | | |
|---|---|---|---|
| 6,724,458 B2 * | 4/2004 | Kim ...................... | G02F 1/1339 349/156 |
| 7,738,067 B2 * | 6/2010 | Chen ................... | G02F 1/13394 349/106 |
| 8,049,233 B2 * | 11/2011 | Fukshima ............... | H01L 33/20 257/98 |
| 8,053,041 B2 * | 11/2011 | Satou ..................... | C08G 73/16 349/106 |
| 8,188,475 B2 * | 5/2012 | Lee ..................... | H01L 27/3253 257/59 |
| 8,314,917 B2 * | 11/2012 | Hwang ............... | G02F 1/13454 349/106 |

(Continued)

FOREIGN PATENT DOCUMENTS

| | | |
|---|---|---|
| KR | 10-1227844 B1 | 1/2013 |
| KR | 10-1397443 B1 | 5/2014 |

(Continued)

*Primary Examiner* — Ida M Soward
(74) *Attorney, Agent, or Firm* — Innovation Counsel LLP

(57) ABSTRACT

A color converter and a method of manufacturing a color converter are provided. The color converter includes: a base substrate; a wavelength conversion pattern layer including a plurality of wavelength conversion layers disposed on the base substrate to be spaced apart from each other, and an overcoat layer disposed on the wavelength conversion pattern layer to cover at least a part of the wavelength conversion pattern layer, wherein the overcoat layer has an upper surface having a higher flatness than a lower surface.

16 Claims, 20 Drawing Sheets

(56) References Cited

U.S. PATENT DOCUMENTS

| | | | |
|---|---|---|---|
| 9,360,699 B2* | 6/2016 | Park | G02F 1/133514 |
| 9,454,027 B2* | 9/2016 | Lee | G02F 1/133377 |
| 9,658,475 B2* | 5/2017 | Kim | G02F 1/0105 |
| 10,241,366 B2* | 3/2019 | Kim | G02F 1/133617 |
| 2011/0090445 A1* | 4/2011 | Kim | G02F 1/1339 |
| | | | 349/139 |
| 2017/0115768 A1* | 4/2017 | Shih | G06F 3/044 |
| 2017/0343855 A1* | 11/2017 | Han | G02F 1/133536 |
| 2018/0059310 A1* | 3/2018 | Bae | G02B 6/005 |

FOREIGN PATENT DOCUMENTS

| | | |
|---|---|---|
| KR | 10-1512274 B1 | 4/2015 |
| KR | 10-2015-0064911 A | 6/2015 |

\* cited by examiner

COLOR CONVERTER HAVING A PLURALITY OF SPACED A PART WAVELENGTH CONVERSION LAYERS

This application claims priority to and benefit of Korean Patent Application No. 10-2017-0119786 filed on Sep. 18, 2017 with the Korean Intellectual Property Office, the disclosure of which is incorporated herein by reference in its entirety.

BACKGROUND

1. Field of the Invention

The present disclosure relates to a color converter and a method of manufacturing the same.

2. Description of the Related Art

A display device may include a color converter for receiving light from a light source, for example, an organic light emitting element or the like and converting the received light to a color. The color converter may be disposed on a display device in the form of a separate substrate or may be integrated directly with elements in the display device.

As an example, the color converter may receive blue light from a light source and emit blue light, green light, and red light, respectively, thereby allowing an image having various colors to be viewed.

The color converter may include an overcoat layer planarizing an upper portion of a wavelength conversion layer, and the overcoat layer may be formed by directly applying an overcoating material onto the wavelength conversion layer. In this case, a flatness of the surface of the overcoat layer may be affected due to a pattern of the wavelength conversion layer that is disposed below.

SUMMARY

An aspect of the present disclosure is to provide a color converter that includes an overcoat layer having an improved surface flatness, and a method of manufacturing the same.

However, aspects of the present disclosure are not restricted to the one set forth herein. The above and other aspects of the present disclosure will become more apparent to one of ordinary skill in the art to which the present disclosure pertains by referencing the detailed description of the present disclosure and the accompanying drawings given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
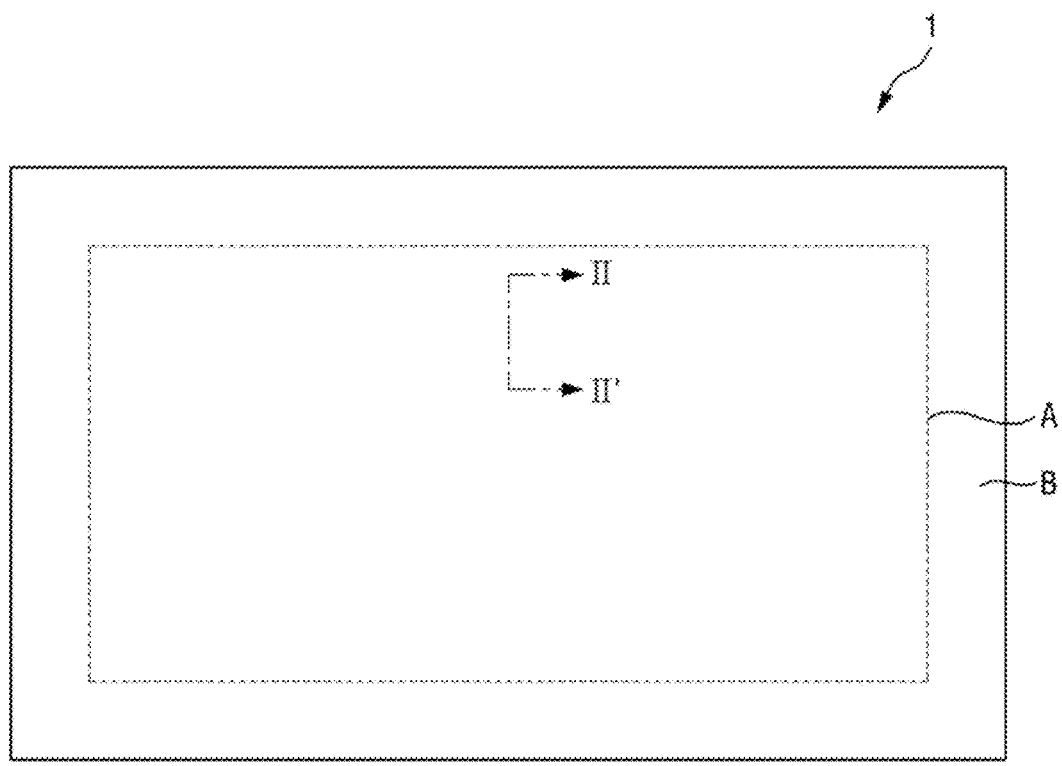
FIG. 1 is a plan view of a color converter according to an embodiment of the present disclosure.

Features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the present disclosure to those skilled in the art.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

It will be understood that when an element or layer is referred to as being "on," "connected to" or "coupled to" another element or layer, the element or layer can be directly on, connected or coupled to another element or layer or one or more intervening elements or layers. In contrast, when an element is referred to as being "directly on," "directly connected to" or "directly coupled to" another element or layer, there are no intervening elements or layers present. As used herein, connected may refer to elements being physically, electrically, and/or fluidly connected to each other.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

Hereinafter, embodiments of the present disclosure will be described with reference to the attached drawings.

Figure 2:
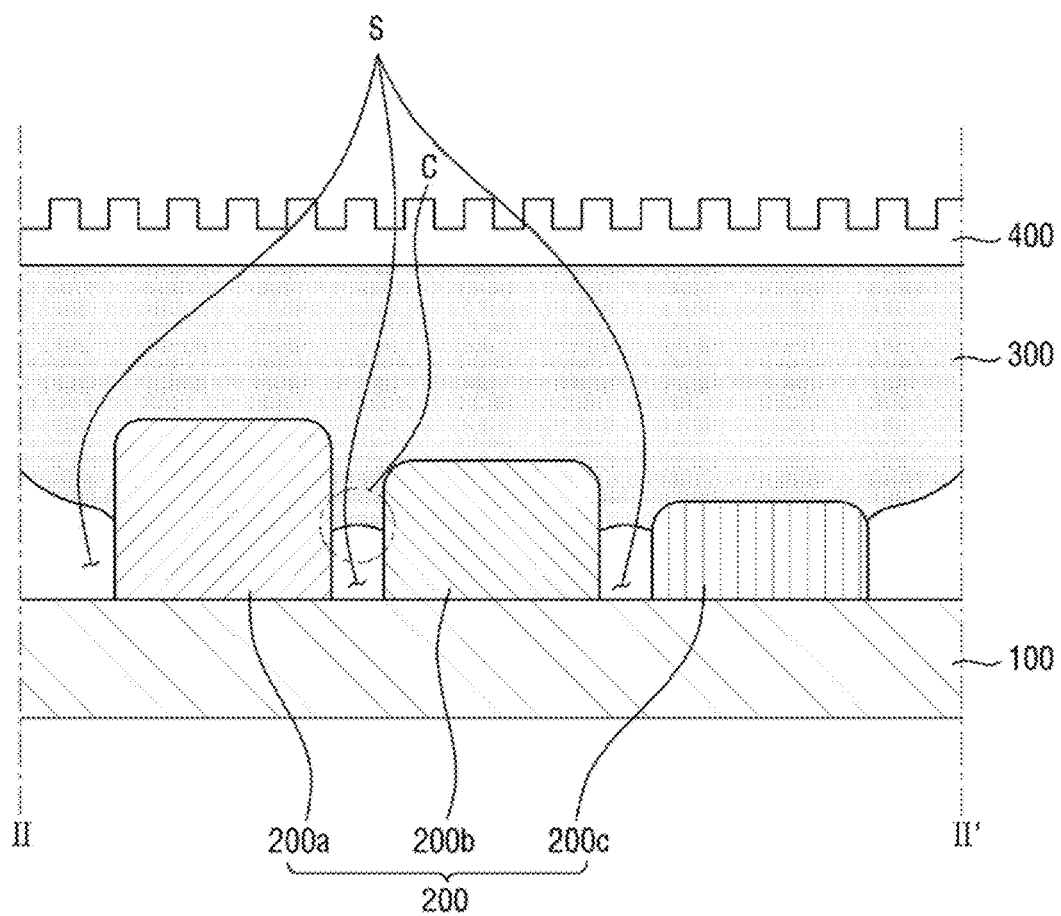
FIG. 2 is a sectional view taken along the line II-II' of FIG. 1.
Figure 3:
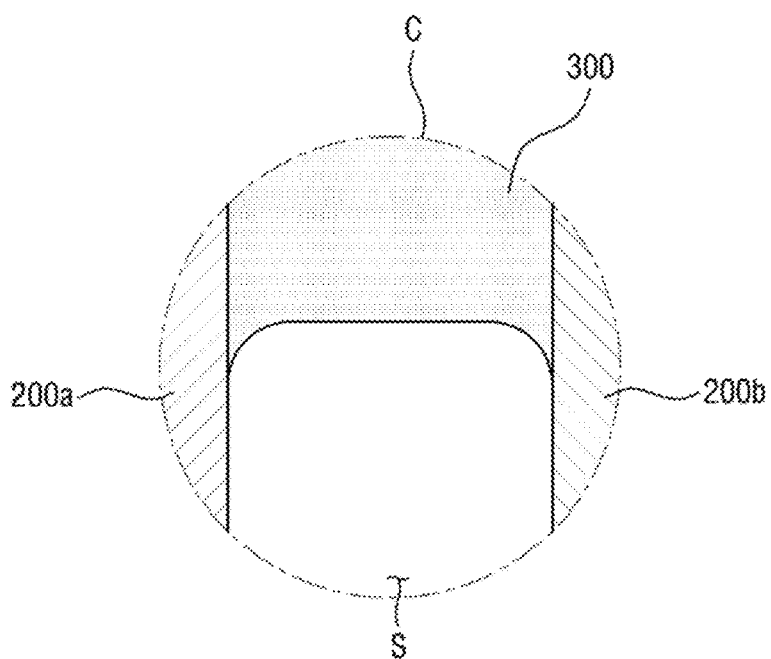
FIG. 3 is an enlarged view of the portion C of FIG. 2.

FIG. 1 is a plan view of a color converter 1 according to an embodiment of the present disclosure, FIG. 2 is a sectional view taken along the line II-II' of FIG. 1, and FIG. 3 is an enlarged view of the portion C of FIG. 2.

First, referring to FIG. 1, the color converter 1 includes a first area A and a second area B in a plan view. The second area B is disposed around the first area A. When the first area A is formed in a rectangular shape as illustrated in FIG. 1, the second area B may be disposed outside the first area A along the periphery of the first area A.

The first area A may be a color conversion area in which wavelength conversion layers 200a, 200b, and 200c are disposed, and the second area B may be an area in which the wavelength conversion layers 200a, 200b, and 200c are not disposed. When the color converter 1 is coupled to a display element (not shown), the first area A of the color converter 1 may correspond to an area in which pixels of the display element are arranged, that is, an area overlapping a display area, and the second area B thereof may correspond to an area in which driving chips, pads, and the like are arranged, that is, an area overlapping a non-display area.

Next, referring to FIG. 2, the color converter 1 includes a base substrate 100, a wavelength conversion pattern layer 200, and an overcoat layer 300. The color converter 1 may further include a polarizing element 400 as a function layer. Herein, the reference numeral 400 may interchangeably refer to either the polarizing element or the function layer.

The base substrate 100 may provide a surface area on which the wavelength conversion pattern layer 200 can be disposed, so as to support the components of the color converter 1. The base substrate 100 may be a light-transmitting substrate. As used herein, the term "light-transmitting" may refer to an optical property of substantially transmitting visible light.

In an exemplary embodiment, when the color converter 1 is coupled to the display element, an upper portion of the color converter 1 may be coupled to the display element with reference to FIG. 1, and the light emitted from the display element may be transmitted from the upper surface of the base substrate 100 toward the lower surface thereof.

The wavelength conversion pattern layer 200 is disposed on the base substrate 100. The wavelength conversion pattern layer 200 may include a plurality of wavelength conversion layers 200a, 200b, and 200c arranged on the base substrate 100 in a predetermined pattern. The plurality of wavelength conversion layers 200a, 200b, and 200c may be disposed to be spaced apart from each other by a predetermined distance.

The plurality of wavelength conversion layers 200a, 200b, and 200c may be divided into a first wavelength conversion layer 200a, a second wavelength conversion layer 200b, and a third wavelength conversion layer 200c. The first, second, and third wavelength conversion layers 200a, 200b, and 200c may be arranged on the base substrate 100 in a predetermined order or pattern. Although FIG. 1 shows an arrangement of order of the first wavelength conversion layer 200a, the second wavelength conversion layer 200b, and the third wavelength conversion layer 200c, the arrangement order or arrangement pattern of these layers is not limited thereto.

The first, second, and third wavelength conversion layers 200a, 200b, and 200c may receive light and emit light having first, second, and third colors, respectively. Each of the wavelength conversion layers 200a, 200b, and 200c may be a layer that converts the light provided from a light source (not shown) into light of a different color, a filter layer that transmits, absorbs, or reflects light of a specific wavelength in the light provided from the light source, or a light-transmitting layer that directly transmits the light provided from the light source. The wavelength conversion pattern layer 200 may have a structure in which two or more of these layers are laminated.

In an exemplary embodiment, the first color may be a blue color having a wavelength band of about 450 nm to 495 nm, the second color may be a green color having a wavelength band of about 495 nm to 570 nm, and the third color may be a red color having a wavelength band of about 620 nm to 750 nm. However, the wavelength bands of the first, second and third colors are not limited to the above examples, and it should be understood that the wavelength bands thereof encompass other wavelength bands that can be perceived as blue, green and red colors.

In an exemplary embodiment, each of the wavelength conversion layers 200a, 200b, and 200c may include wavelength conversion particles for converting the light provided from the light source into light of a different color. The wavelength converting particles may be, for example, quantum dots (QD), fluorescent particles, or phosphorescent particles.

In another exemplary embodiment, the second wavelength conversion layer 200b may include wavelength conversion particles for converting the light provided from the light source into light having the second color, the third wavelength conversion layer 200c may include wavelength conversion particles for converting the light provided from the light source into light having the third color, and the first wavelength conversion layer 200a may not include wavelength conversion particles. However, the embodiments of the wavelength conversion layers 200a, 200b, and 200c of the present disclosure are not limited thereto.

The quantum dot that is used as an example of the color conversion particle is a material having a crystal structure of several nanometers in size. The quantum dot is typically composed of hundreds to thousands of atoms, and exhibits a quantum confinement effect in which an energy band gap is increased due to a small size. When light having a wavelength higher than the band gap is incident on the quantum dot, the quantum dot is excited by absorbing the light and falls to a ground state while emitting light of a specific wavelength. The emitted light of the specific wavelength has a value corresponding to the band gap. The luminescence characteristics caused by the quantum confinement effect can be controlled by adjusting the size and composition of the quantum dot.

The quantum dot may contain at least one of group II-VI compounds, group II-V compounds, group III-VI compounds, group III-V compounds, group IV-VI compounds, group I-III-VI compounds, group II-IV-VI compounds, and group II-IV-V compounds.

The quantum dot may include a core and a shell overcoating the core. Examples of the core may include, but are not limited to, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. Examples of the shell may include, but are not limited to, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

When light is incident on the color conversion particle to convert its wavelength and is then emitted, its emission direction has random scattering characteristics. Accordingly, the wavelength conversion layers 200a, 200b, and 200c containing such wavelength conversion particles may have uniform front and side luminance without containing a scattering agent. However, the wavelength conversion layers 200a, 200b, and 200c may contain a scattering agent for further improving the uniformity of the luminance and/or controlling a viewing angle of the emitted light.

The thicknesses of the respective wavelength conversion layers 200a, 200b, and 200c may be different from each other. That is, a height step may exist between the adjacent wavelength conversion layers 200a, 200b, and 200c. As shown in FIG. 2, the thickness of the first wavelength conversion layer 200a emitting the light of the first color may be larger than each of the thicknesses of the second and third wavelength conversion layers 200b and 200c respectively emitting the light of the second and third colors, but the present disclosure is not limited thereto.

Although not shown in FIG. 2, a light-blocking member substantially blocking the transmission of visible light may be further disposed on the base substrate 100. In this case, the light-blocking member may be disposed between the adjacent wavelength conversion layers 200a, 200b, and 200c, and the light-blocking member and the wavelength conversion layers 200a, 200b, and 200c may partially overlap each other.

The light-blocking member may be disposed to improve color reproducibility by preventing the color mixture occurring between the adjacent wavelength conversion layers 200a, 200b, and 200c.

The overcoat layer 300 is disposed to cover at least a part of the plurality of wavelength conversion layers 200a, 200b, and 200c, that is, the wavelength conversion pattern layer 200. Specifically, the overcoat layer 300 may be disposed on the wavelength conversion pattern layer 200 to cover a part of side surfaces and an upper surface of each of the wavelength conversion layers 200a, 200b, and 200c.

The overcoat layer 300 may planarize the upper portion of the wavelength conversion pattern layer 200 and protect underlying components such as the wavelength conversion pattern layer 200 and the like. The overcoat layer 300 may be formed of a light-transmitting material to transmit the light provided from the light source to the wavelength conversion pattern layer 200.

The overcoat layer 300 may not completely fill a space between adjacent wavelength conversion layers 200a, 200b, and 200c. In this case, a space S formed by air or vacuum may be defined between the overcoat layer 300 and the base substrate 100. Specifically, the space S may be defined between adjacent wavelength conversion layers 200a, 200b, and 200c as being surrounded by the lower surface of the overcoat layer 300, the side surfaces of the wavelength conversion layers 200a, 200b, and 200c, and the upper surface of the base substrate 100. When a light-blocking member (not shown) is disposed, the space S may be surrounded by a surface of the light-blocking member instead of the base substrate 100.

As used herein, the term "vacuum" may refer to a substantial vacuum condition having an atmospheric pressure of about $10^{-2}$ to $10^{-6}$ mmHg. Further, the terms "upper surface" and "lower surface" of a certain component may refer to not only a pair of parallel surfaces located opposite to each other but also surfaces located at relatively upper and lower sides of the component with reference to the drawing. That is, the "upper surface" and "lower surface" may refer to any case that can be recognized as substantially upper and lower surfaces.

Since the space S between adjacent wavelength conversion layers 200a, 200b, and 200c is made of air or vacuum, its refractive index is relatively low, and the light reflected in a lateral direction in each of the wavelength conversion layers 200a, 200b, and 200c may be recycled, thereby increasing light efficiency, luminance, and the like.

Although it is illustrated in FIG. 2 that the overcoat layer 300 and the base substrate 100 are not in contact with each other, the present disclosure is not limited thereto. A part of the overcoat layer 300 may be disposed to be in contact with the base substrate 100. When a light-blocking member (not shown) is disposed, a part of the overcoat layer 300 may be disposed to be in contact with the light-blocking member.

Referring to FIG. 3, the overcoat layer 300 may have a shape in which a portion disposed between the wavelength conversion layers 200a, 200b, and 200c is constricted upward compared to a portion being in contact with the side surfaces of each of the wavelength conversion layers 200a, 200b, and 200c. That is, the overcoat layer 300 may have a shape in which a portion being in contact with each of the wavelength conversion layers 200a, 200b, and 200c extends in a downward direction along the side surfaces of each of the wavelength conversion layers 200a, 200b, and 200c by mutual surface tension, and a portion not being in contact therewith is relatively constricted to be depressed in an upward direction.

The upper surface of the overcoat layer 300 may have a higher flatness than the lower surface thereof. The fact that the upper surface of the overcoat layer 300 has a higher flatness than the lower surface thereof may indicate that the upper surface of the overcoat layer 300 has lower surface roughness than the lower surface thereof. The lower surface of the overcoat layer 300 may be relatively curved compared to the upper surface thereof. In an exemplary embodiment, the flatness of the upper surface of the overcoat layer 300 may be 40 nm or less, but is not limited thereto.

Referring to FIG. 2 again, the function layer 400 is disposed on the overcoat layer 300. The function layer 400 may be disposed directly on the overcoat layer 300 to cover the upper surface of the overcoat layer 300. The function layer 400 refers to an element, a film, or the like that is capable of performing a specific function, and examples thereof may include, but are not limited to, a polarizing element, an inorganic film, and an organic film. FIG. 2 illustrates a case where a polarizing element is disposed as the function layer 400.

As described above, since the upper surface of the overcoat layer 300 has a higher flatness than the lower surface thereof, in a process of directly forming the function layer 400 such as a polarizing element, a defective rate thereof can be reduced.

Figure 4:
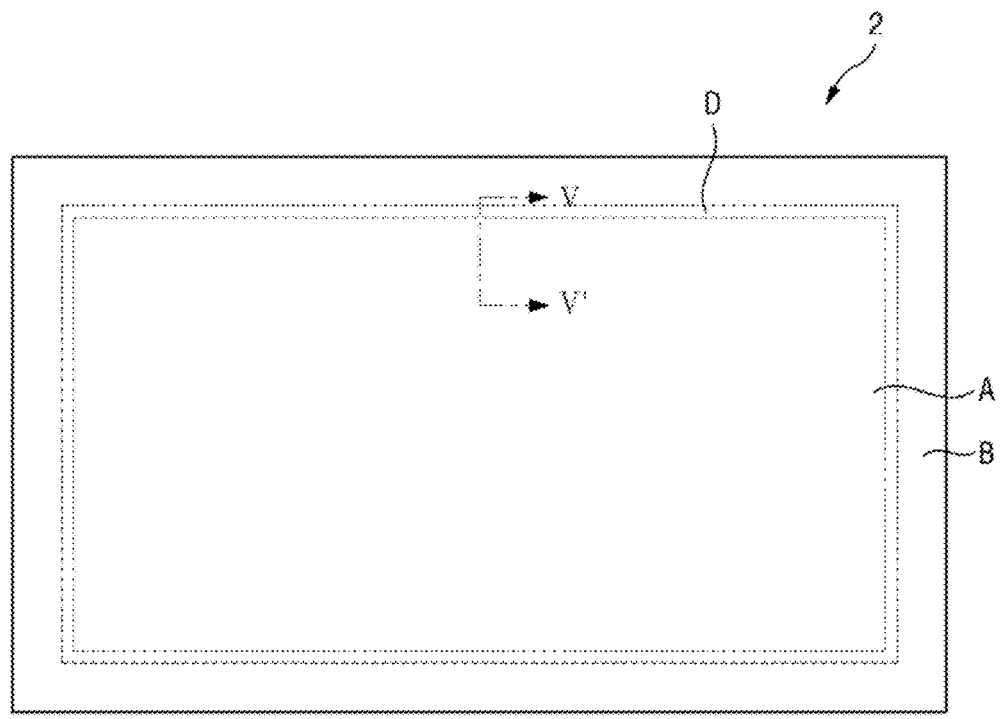
FIG. 4 is a plan view of a color converter according to another embodiment of the present disclosure.
Figure 5:
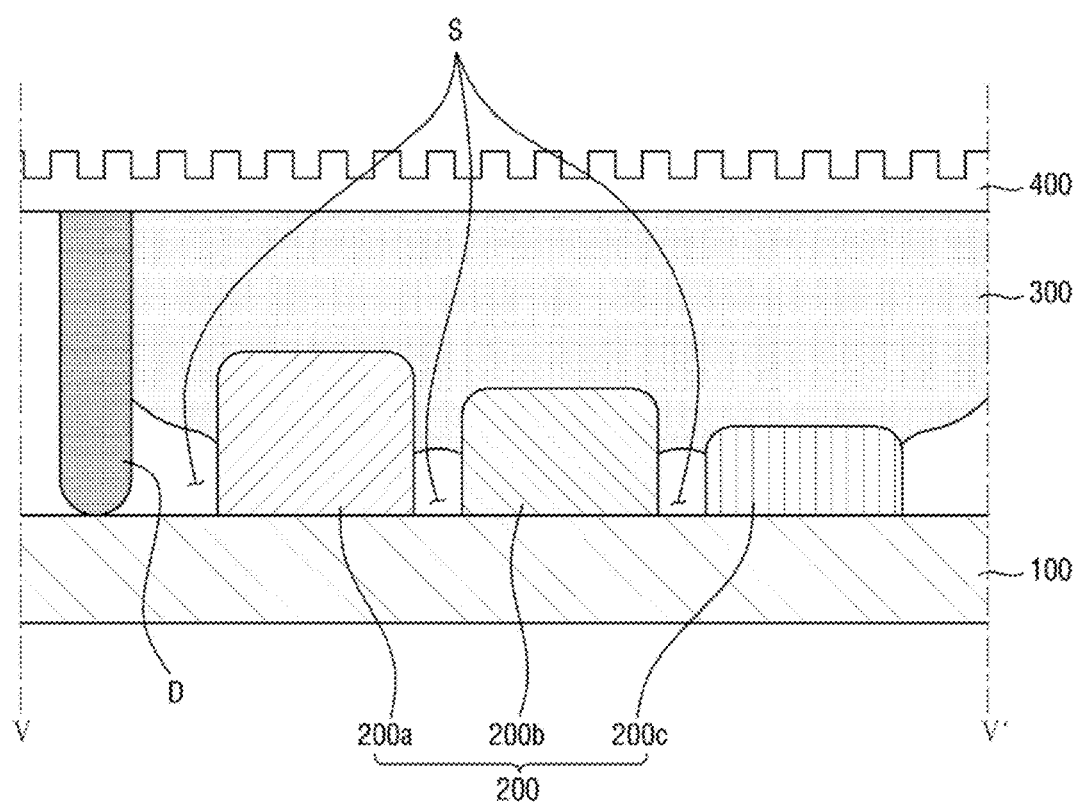
FIG. 5 is a sectional view taken along the line V-V' of FIG. 4.

FIG. 4 is a plan view of a color converter according to another embodiment of the present disclosure, and FIG. 5 is a sectional view taken along the line V-V' of FIG. 4.

The color converter 2 of FIGS. 4 and 5 is the same as the color converter 1 having been described with reference to FIGS. 1 to 3, except that it further includes a dam member D. Hereinafter, duplicate descriptions will be omitted, and differences will be mainly described.

First, referring to FIG. 4, the dam member D may be disposed in a plan view to surround the periphery of an area in which the wavelength conversion pattern layer 200 and the overcoat layer 300 are disposed. In other words, the dam member D may be disposed along the boundary of the first area A and the second area B to surround the area A.

Next, referring to FIG. 5, the dam member D may be disposed between the base substrate 100 and the function layer 400 in a sectional view. When a light-blocking member (not shown) is disposed, the dam member D may be disposed between the light-blocking member and the function layer 400.

The dam member D may be a frame-shaped member that directly contacts a side surface of the overcoat layer 300 and surrounds the overcoat layer 300. That is, the dam member D may be a member for accommodating the overcoat layer 300 that is disposed inside the dam member D.

The dam member D may be formed of a sealant, and may further include a bead-shaped spacer dispersed in the sealant to impart a restoring force to the sealant or function as a skeleton of the dam member D. However, the material for the dam member D is not limited thereto, and other materials that are capable of performing a substantial dam function for accommodating the overcoat layer 300 may be used without limitation.

Similarly to the overcoat layer 300, the upper surface the dam member D may have a higher flatness than the lower surface thereof. Thus, a contact area between the dam member D and the function layer 400 may be larger than a contact area between the dam member D and the base substrate 100. When a light-blocking member (not shown) is disposed, a contact area between the dam member D and the function layer 400 may be larger than a contact area between the dam member D and the light-blocking member. FIG. 5 illustrates a case where a lower surface of the dam member D is curved, but the present disclosure is not limited thereto.

FIG. 5 illustrates a case where a part of the lower surface of the dam member D is in contact with the base substrate 100, but the present disclosure is not limited thereto. The dame member D may be disposed to be substantially spaced apart from the base substrate 100 without being in contact with the base substrate 100.

A space S formed by air or vacuum may be defined between the dam member D and each of the adjacent wavelength conversion layers 200a, 200b, and 200c, for example, between the dam member D and the first wavelength conversion layer 200a. The space S can recycle light by reflecting the light emitted toward the dam member D in the first wavelength conversion layer 200a.

Figure 6:
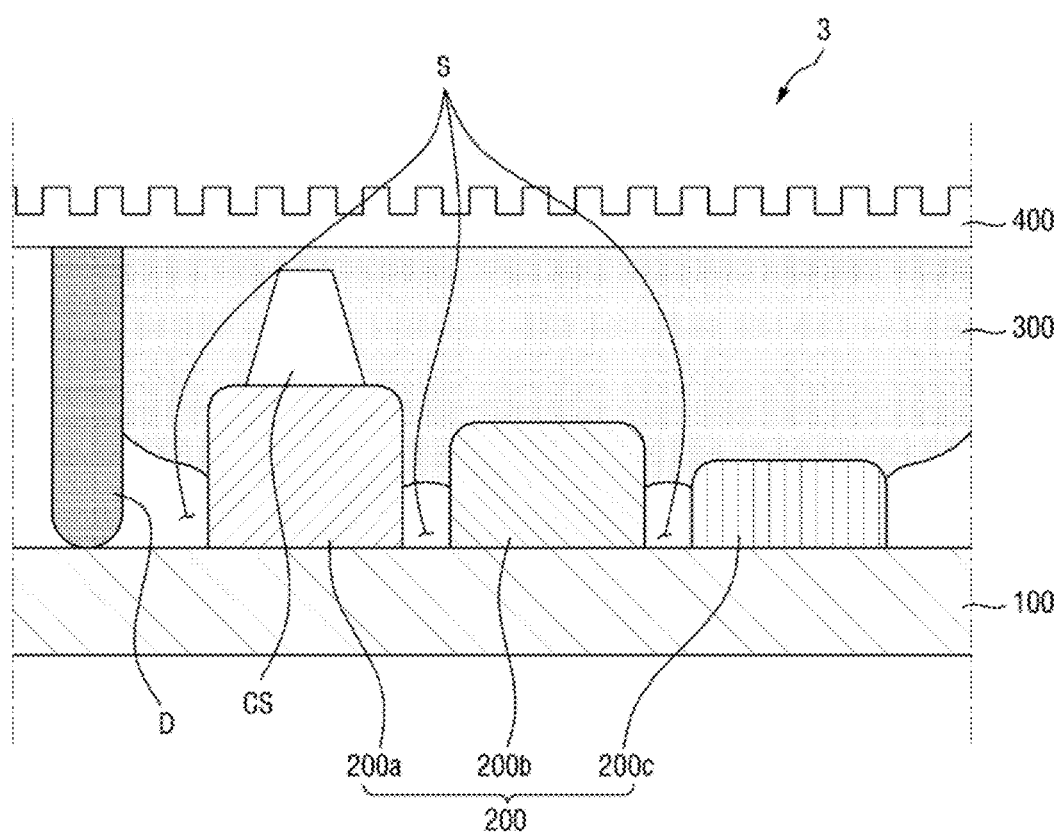
FIGS. 6, 7, and 8 are sectional views of color converters according to other embodiments of the present disclosure.

FIG. 6 is a sectional view of a color converter 3 according to another embodiment of the present disclosure.

The color converter 3 of FIG. 6 is the same as the color converter 2 having been described with reference to FIGS. 4 and 5, except that it further includes a column spacer CS. Hereinafter, duplicate descriptions will be omitted, and differences will be mainly described.

Referring to FIG. 6, the column spacer CS may be disposed on at least one of the wavelength conversion layers 200a, 200b, and 200c. The column spacer CS may be disposed only on the thickest wavelength conversion layer 200a that is thickest and tallest among the wavelength conversion layers 200a, 200b, and 200c. FIG. 6 illustrates a case where the column spacer CS is disposed only on the thickest first wavelength conversion layer 200a, but the embodiment of the column spacer CS is not limited thereto.

The column spacer CS may be disposed to prevent elements such as the base substrate 100 and wavelength conversion pattern layer 200 disposed in the color converter in a plan view from sagging in a gravitational direction. Accordingly, the column spacers CS may be disposed only on the wavelength conversion layers 200a, 200b, and 200c that are disposed at a center of the first area A in a plan view, or may be collectively disposed on the wavelength conversion layers 200a, 200b, and 200c that are disposed at the center of the first area A. However, the present disclosure is not limited thereto.

The column spacer CS may be made of a light-transmitting material. Therefore, the light provided from the light source can be transmitted to the wavelength conversion layers 200a, 200b, and 200c without being attenuated due to the column spacer CS.

Figure 7:
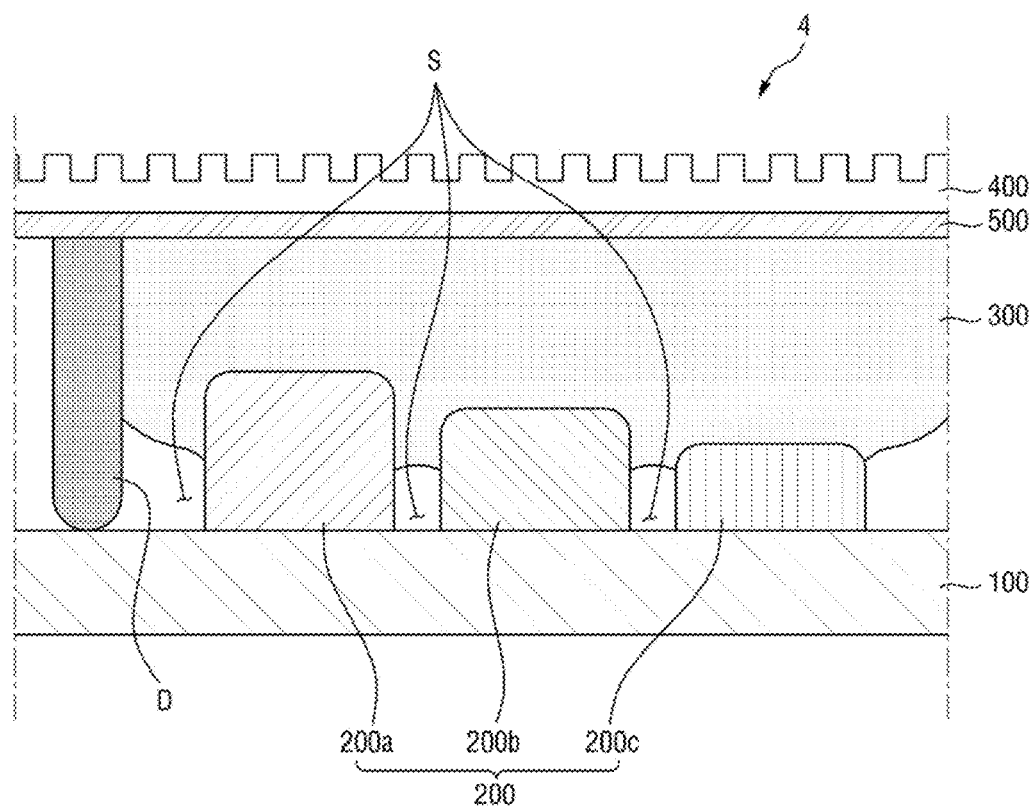

FIG. 7 is a sectional view of a color converter 4 according to another embodiment of the present disclosure.

The color converter 4 of FIG. 7 is the same as the color converter 2 having been described with reference to FIGS. 4 and 5, except that it further includes an inorganic film 500. Hereinafter, duplicate descriptions will be omitted, and differences will be mainly described.

Referring to FIG. 7, the inorganic film 500 may be disposed between the overcoat layer 300 and the polarizing element 400 and between the dam member D and the polarizing element 400. Specifically, the inorganic film 500 may be disposed to cover the upper surface of the over coat layer 300 and the upper surface of the dam member D. The inorganic film 500 may be disposed to be wider than the overcoat layer 300 and the dam member D, and thus a part of the inorganic film 500 may overlap the second area of the color converter 4.

In this case, a function layer may be defined as a layer including the polarizing element 400 and the inorganic film 500. The inorganic film 500 can serve to enhance a strength of the color converter 4 and to protect the overcoat layer 300 and the dam member D.

Although not shown in the drawing, the function layer may include an organic material-based film instead of the aforementioned inorganic film, or may include both the inorganic film and the organic material-based film.

Figure 8:
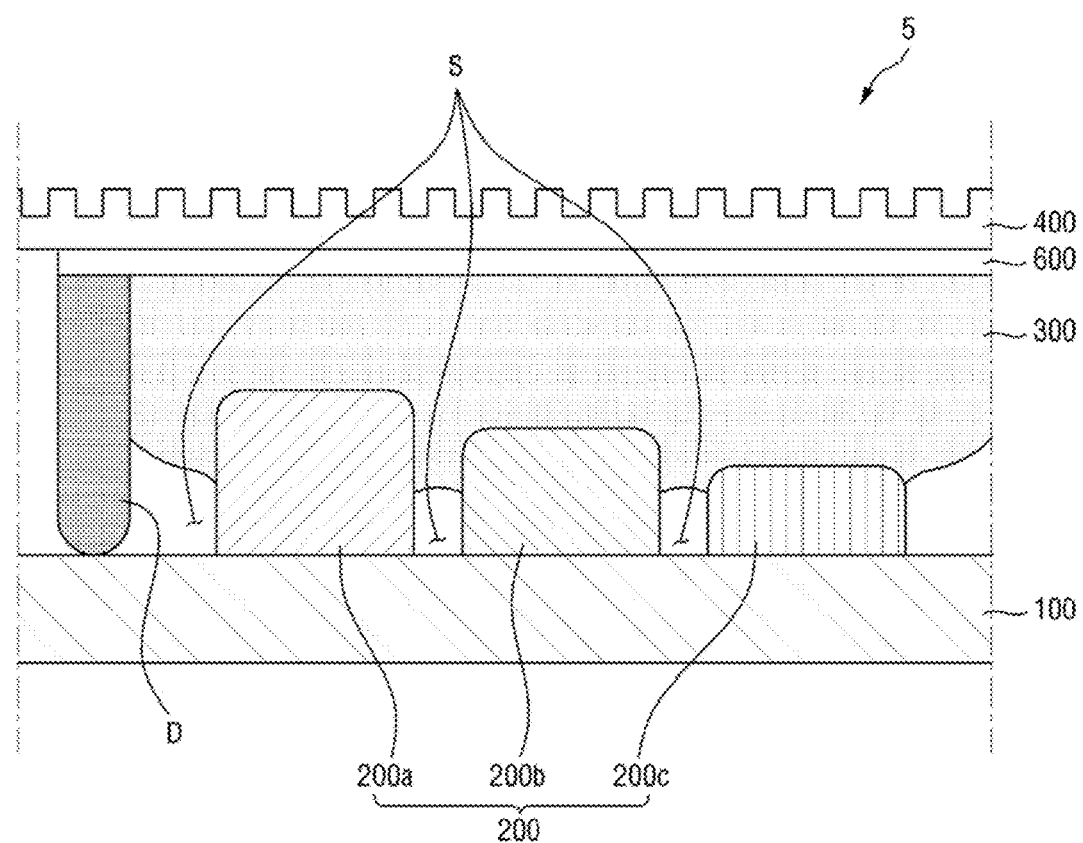

FIG. 8 is a sectional view of a color converter 5 according to another embodiment of the present disclosure.

The color converter 5 of FIG. 8 is the same as the color converter 2 having been described with reference to FIGS. 4 and 5, except that it further includes a fluorinated film 600. Hereinafter, duplicate descriptions will be omitted, and differences will be mainly described.

Referring to FIG. 8, the fluorinated film 600 may be disposed between the overcoat layer 300 and the polarizing element 400 and between the dam member D and the polarizing element 400. The fluorinated film 600 may contain a material having a fluorine group. Unlike the aforementioned inorganic film 500 shown in FIG. 7, the fluorinated film 600 may be disposed only on the upper surface of the overcoat layer 300 and the upper surface of the dam member D.

The fluorinated film 600 may be formed by attaching a sacrificial substrate coated with a fluorinated material, which will be described later, to an upper surface of the overcoat layer 300 and an upper surface of the dam member D in a process of manufacturing the color converter 5. Details thereof will be described later.

FIGS. 9A to 14 are sectional views of a method of manufacturing the color converter 2 shown in FIGS. 4 and 5 according to process steps.

Referring to FIGS. 9A, 9B, 10A, and 10B, first, a first attaching assembly 10 including a wavelength conversion pattern layer 200 and a second attaching assembly 20 including an overcoating material OCM are prepared.

Figure 9A:
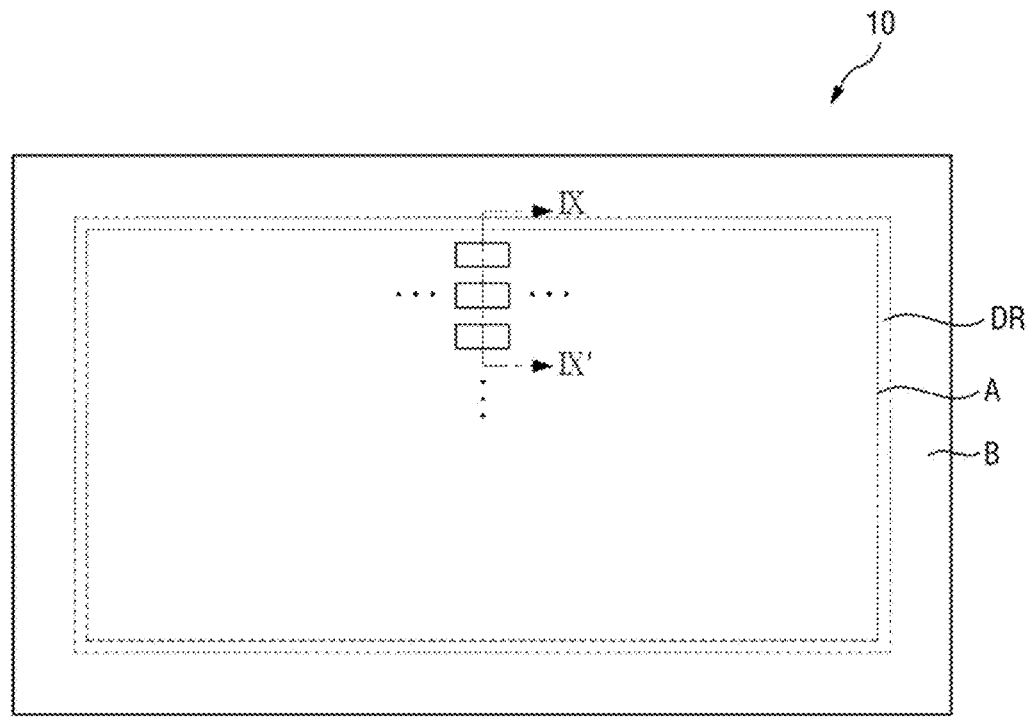
FIGS. 9A, 9B, 10A, 10B, 11, 12, 13, and 14 are sectional views of a method of manufacturing the color converter shown in FIGS. 4 and 5 according to process steps.
Figure 9B:
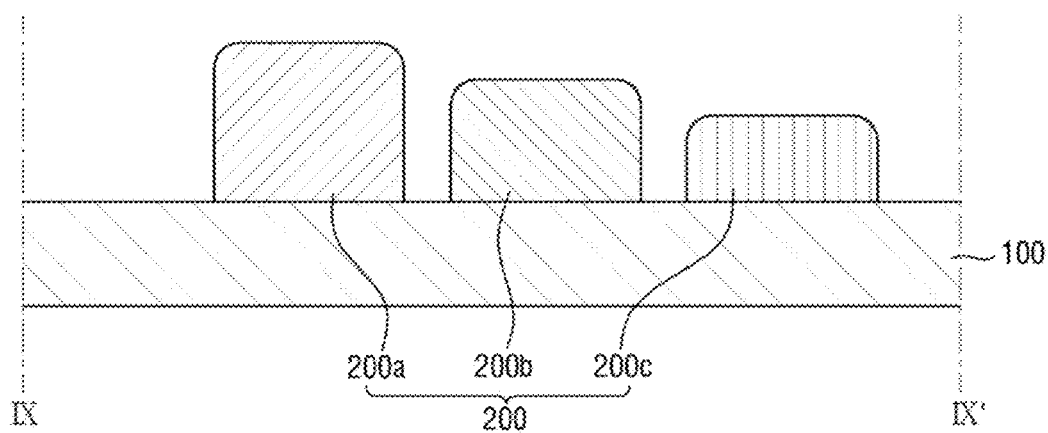

FIG. 9A is a plan view of the first attaching assembly 10, and FIG. 9B is a sectional view taken along the line IX-IX' of FIG. 9A. The first attaching assembly 10 may be prepared by forming a plurality of wavelength conversion layers 200a, 200b, and 200c on a base substrate 100 to be spaced apart from each other. A dam member region DR may correspond to a region of the first attaching assembly 10 in which a dam member D shown in FIG. 10B is to be disposed when the first attaching assembly 10 and the second attaching assembly 20 are attached.

Figure 10A:
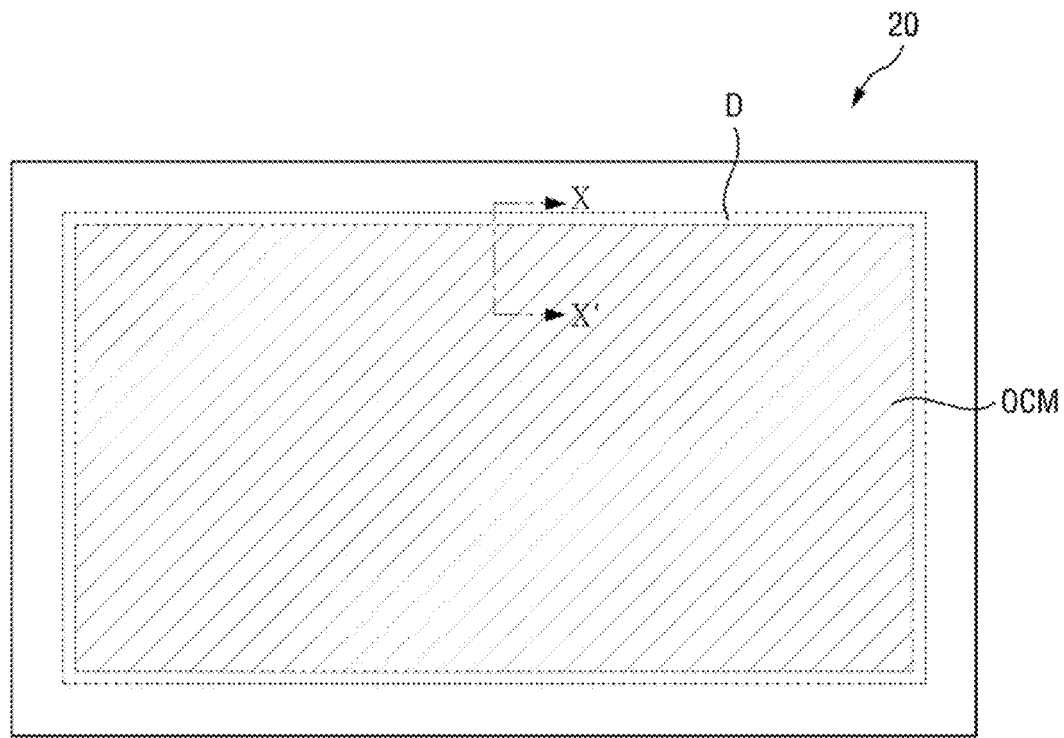
Figure 10B:
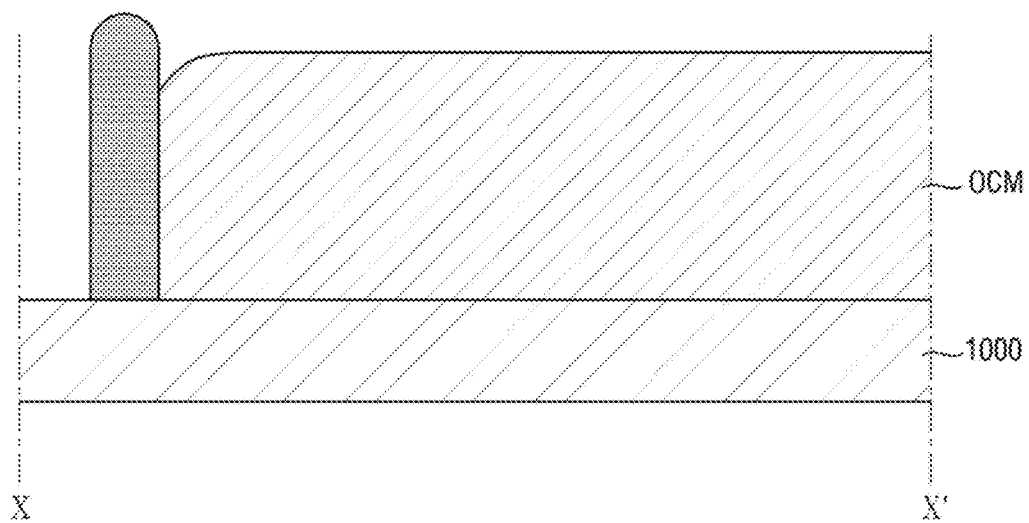

FIG. 10A is a plan view of the second attaching assembly 20, and FIG. 10B is a sectional view taken along the line X-X' of FIG. 10A. The second attaching assembly 20 may be prepared by forming a dam member Don a sacrificial substrate 1000 in a frame shape and applying an overcoating material OCM to an inside of the dam member D. The overcoating material OCM may be accommodated by the dam member D without flowing to an outside of the dam member D.

The overcoating material OCM may contain a thermosetting polymer that is cured by an application of heat, but the present disclosure is not limited thereto. The overcoating material OCM may also contain a photocurable polymer that is cured by an application of light. The thermosetting polymer or the photocurable polymer may be a material whose adhesive force with the sacrificial substrate 1000 is weakened during curing.

The overcoating material OCM may be a light-transmitting material or a material having light transmittance when cured. That is, the overcoating material OCM may be the light-transmitting material that has light transmittance always before and after curing, or may be one that does not have light transmittance before curing and has light transmittance after cured.

Figure 11:
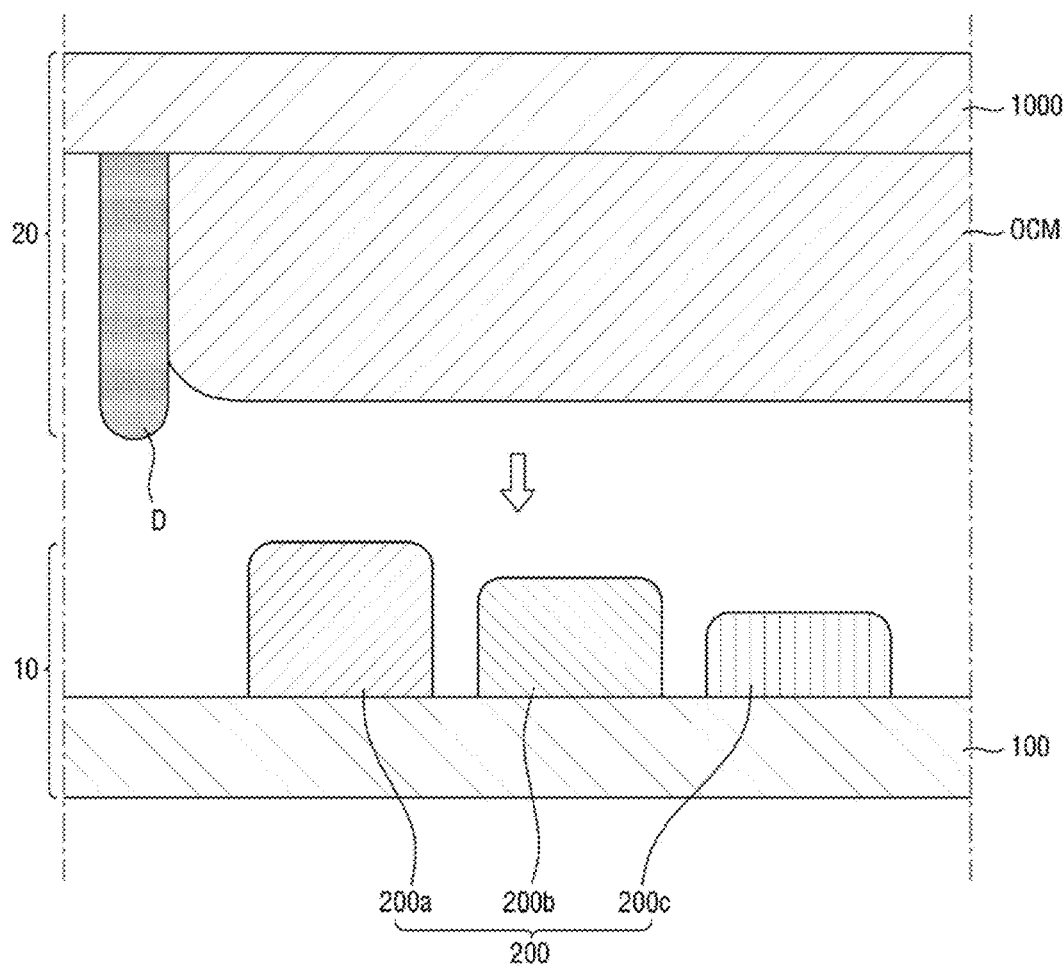

Referring to FIG. 11, the first attaching assembly 10 and the second attaching assembly 20 are attached to each other. At this time, the wavelength conversion pattern layer 200 of the first attaching assembly 10 and the overcoating material OCM of the second attaching assembly 20 may be made to be in contact with each other and face each other, and the dam member D of the second attaching assembly 20 may overlap the dam member region DR of the first attaching assembly 10.

Figure 12:
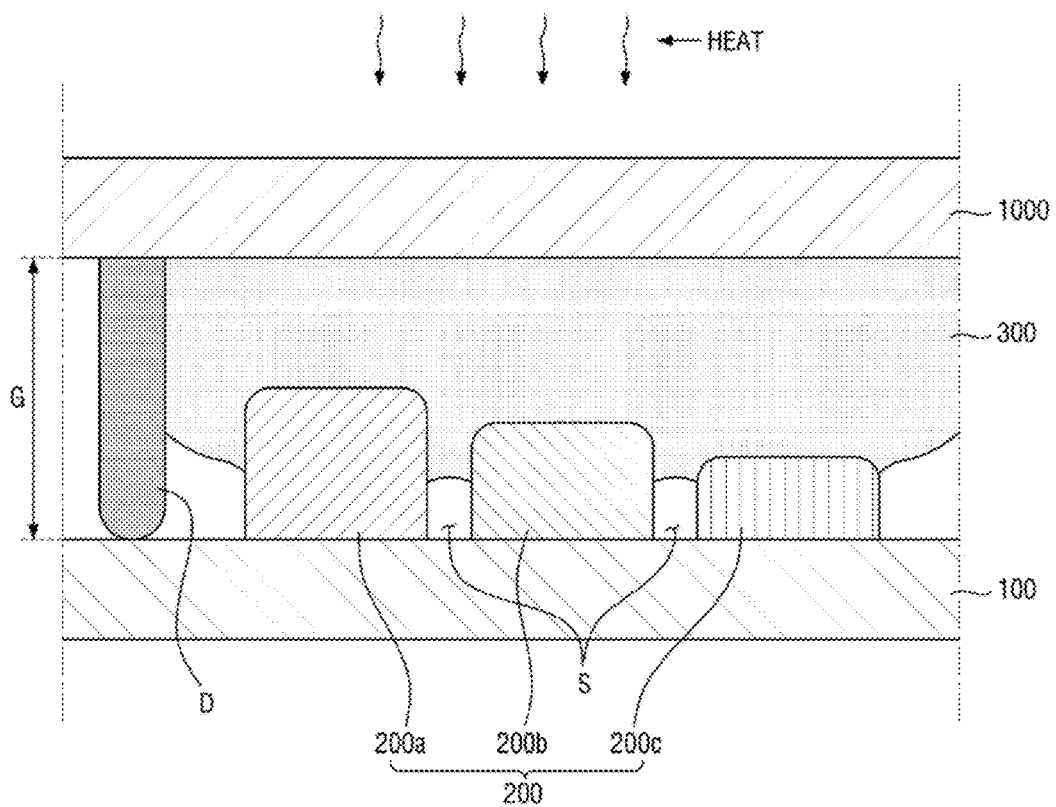

Referring to FIG. 12, heat is subsequently applied to the overcoating material OCM to cure the overcoating material OCM. The overcoating material OCM is cured while covering an upper surface of each of the wavelength conversion layers 200a, 200b, and 200c and a part of a side surface thereof, so as to be formed into an overcoat layer 300.

While attaching the first attaching assembly 10 to the second attaching assembly 20 and curing the overcoating material OCM, a gap G between the base substrate 100 and the sacrificial substrate 1000 may be maintained such that a space between the base substrate 100 and the sacrificial substrate 1000 is occupied with the overcoating material OCM while forming a space S that is filled with air or vacuum between the overcoating material OCM and the base substrate 100.

When the overcoating material OCM contains a photocurable polymer, the overcoating material OCM may be cured by applying light.

Figure 13:
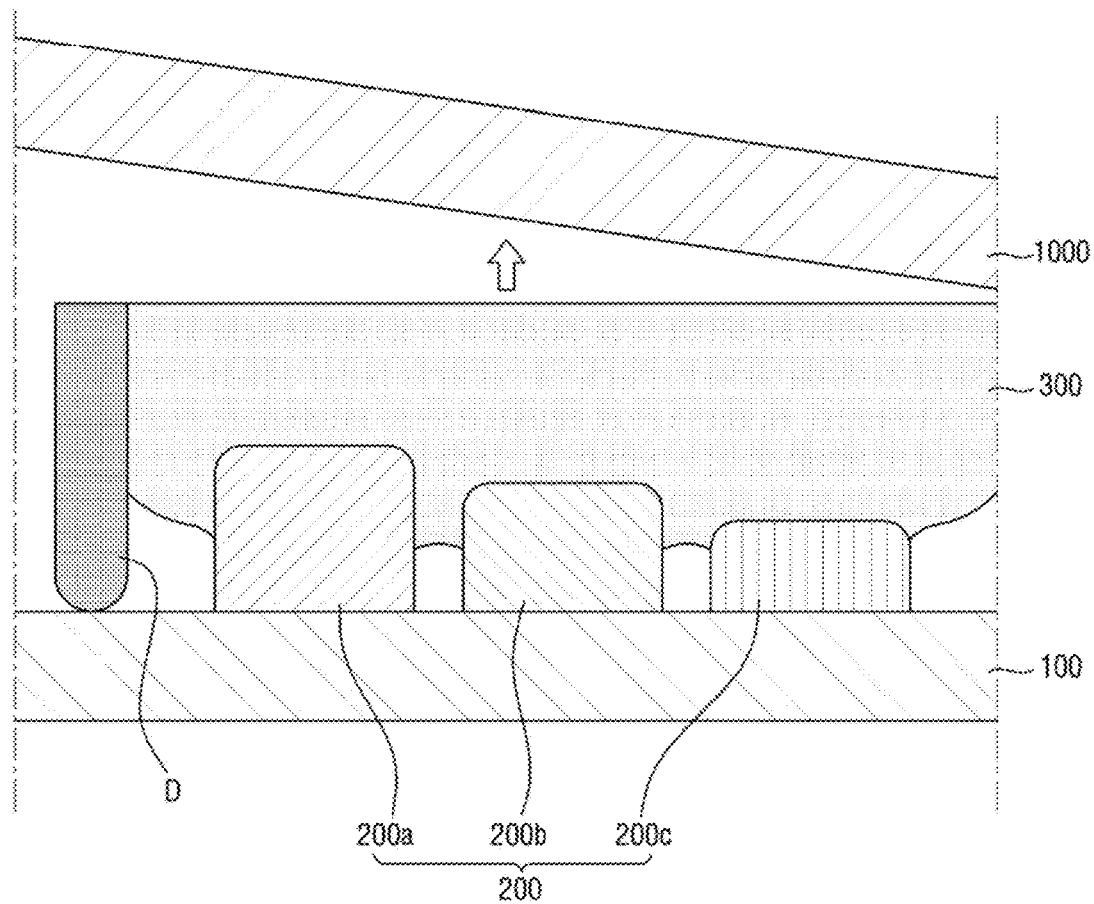

Referring to FIG. 13, the sacrificial substrate 1000 is detached from the overcoat layer 300 and the dam member D. When the overcoat layer 300 contains a polymer material whose adhesive force with the sacrificial substrate 1000 is weakened during curing, the sacrificial substrate 1000 can be more easily detached.

Since the overcoat layer 300 and the dam member D are directly formed on the sacrificial substrate 100 and then disposed on the base substrate 100 through attaching, the flatness of the upper surface of the overcoat layer 300 and the dam member D may be higher than the flatness of the lower surface thereof. For example, the upper surface of the overcoat layer 300 has a flatness of about 40 nm or less.

Figure 14:
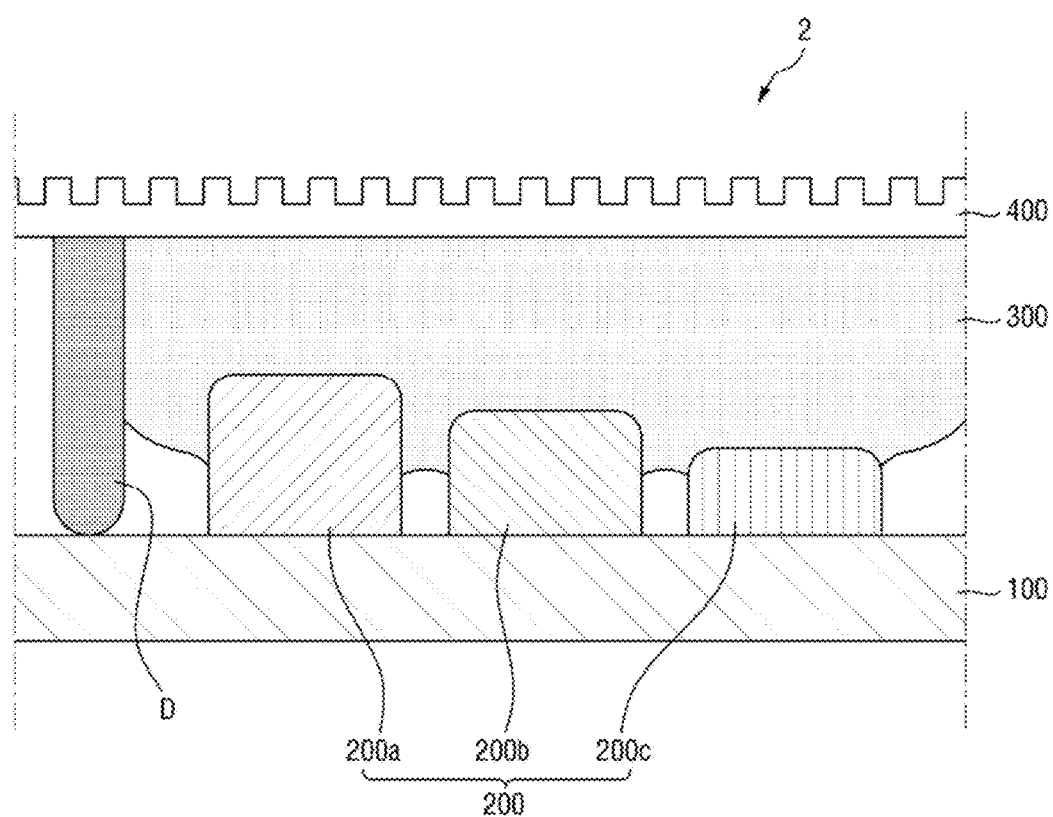

Referring to FIG. 14, a polarizing element 400 is formed on the overcoat layer 300 and the dam member D to manufacture the color converter 2 of FIGS. 4 and 5. As described above, due to the flatness of the upper surface of the overcoat layer 300, a defective rate of the polarizing element 400 can be greatly reduced in a process of directly forming the polarizing element 400 on the upper surface of the overcoat layer 300 and the dam member D.

Figure 15:
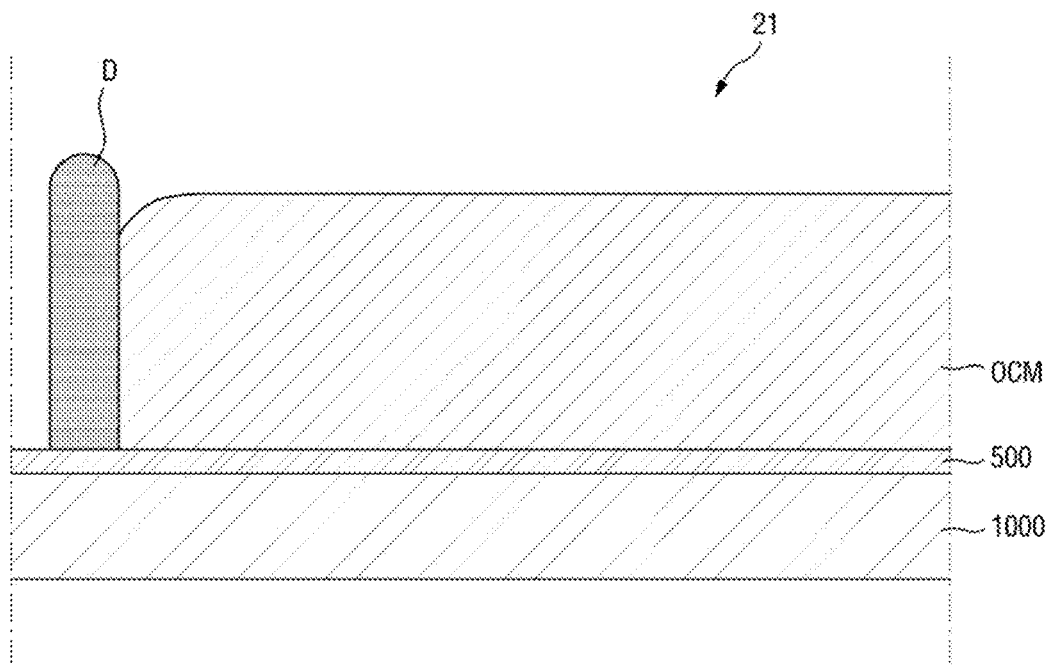
FIGS. 15 and 16 are sectional views of a method of manufacturing the color converter shown in FIG. 7 according to some process steps.
Figure 16:
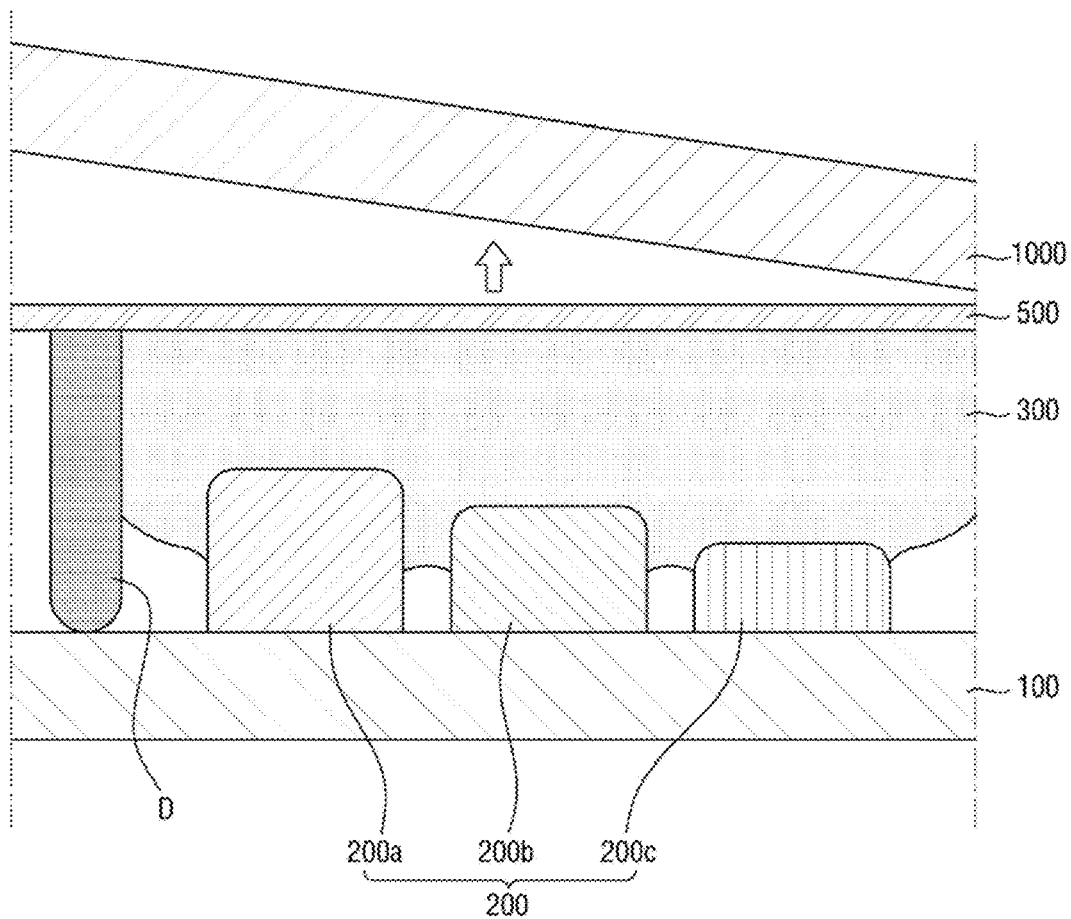

FIGS. 15 and 16 are sectional views of a method of manufacturing the color converter 4 shown in FIG. 7 according to some process steps. Hereinafter, the duplicate descriptions corresponding to the manufacturing method of FIGS. 9 to 14 will be omitted, and differences will be mainly described.

Referring to FIG. 15, when preparing a second attaching assembly 21, an inorganic film 500 is formed on the sacrificial substrate 1000, and then the dam member D and the overcoating material OCM are formed on the inorganic film 500.

Referring to FIG. 16, when detaching the sacrificial substrate 1000, the sacrificial substrate 1000 is detached from the inorganic film 500, and the inorganic film 500 remains on the overcoat layer 300 and the dam member D, thereby manufacturing the color converter 4 of FIG. 7.

Since other process steps are substantially the same as those described above with reference to FIGS. 9 to 14, detailed description thereof will be omitted.

Figure 17:
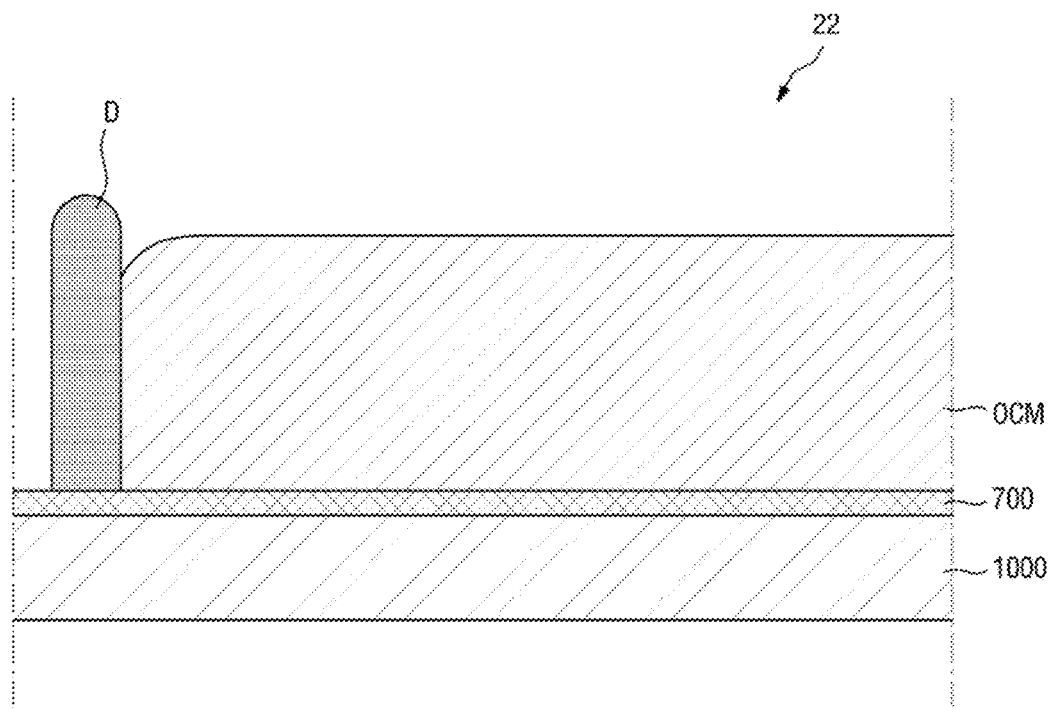
FIGS. 17 and 18 are sectional views of a method of manufacturing the color converter shown in FIGS. 4 and 5 according to another embodiment of the present disclosure according to some process steps.
Figure 18:
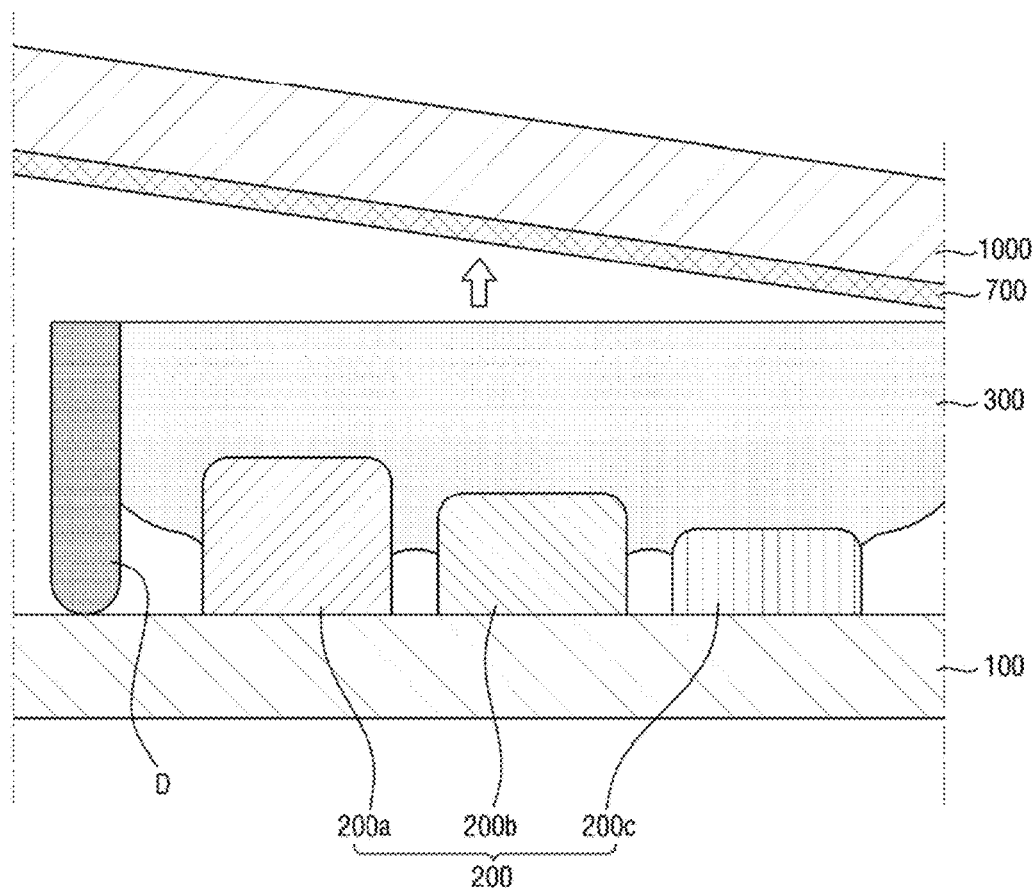

FIGS. 17 and 18 are sectional views of a method of manufacturing the color convener 2 shown in FIGS. 4 and 5 according to some process steps. Hereinafter, the duplicate descriptions corresponding to the manufacturing method of FIGS. 9 to 14 will be omitted, and differences will be mainly described.

Referring to FIG. 17, when preparing a second attaching assembly 22, a transfer layer 700 is formed on the sacrificial substrate 1000, and then the dam member D and the overcoating material OCM are formed on the transfer layer 700. The transfer layer 700 may be formed to easily detach the sacrificial substrate 1000 from the overcoating material OCM and the dam member D, and may be made of a material whose adhesive force or surface energy to the sacrificial substrate 100 is higher than an adhesive force or a surface energy to the overcoat layer 300 and the dam member D.

Referring to FIG. 18, when detaching the sacrificial substrate 1000, the transfer layer 700 is also detached together with the sacrificial substrate 1000, thereby manufacturing the color converter 2 of FIGS. 4 and 5. As described above, since the adhesive force or the surface energy of the transfer layer 700 to the sacrificial substrate 1000 is relatively high, when detaching the sacrificial substrate 1000, the transfer layer 700 may be detached from the overcoat layer 300 and the dam member D together with the sacrificial substrate 1000.

Since other process steps are substantially the same as those described above with reference to FIGS. 9 to 14, detailed description thereof will be omitted.

Figure 19:
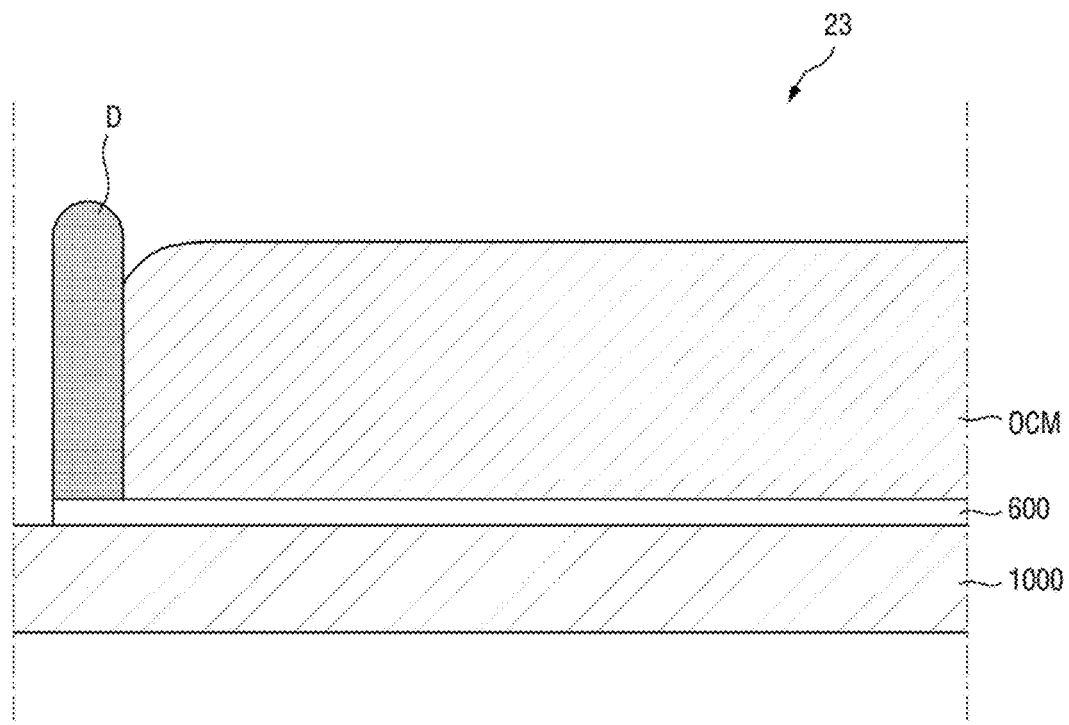
FIGS. 19 and 20 are sectional views of a method of manufacturing the color converter shown in FIG. 8 according to some process steps.
Figure 20:
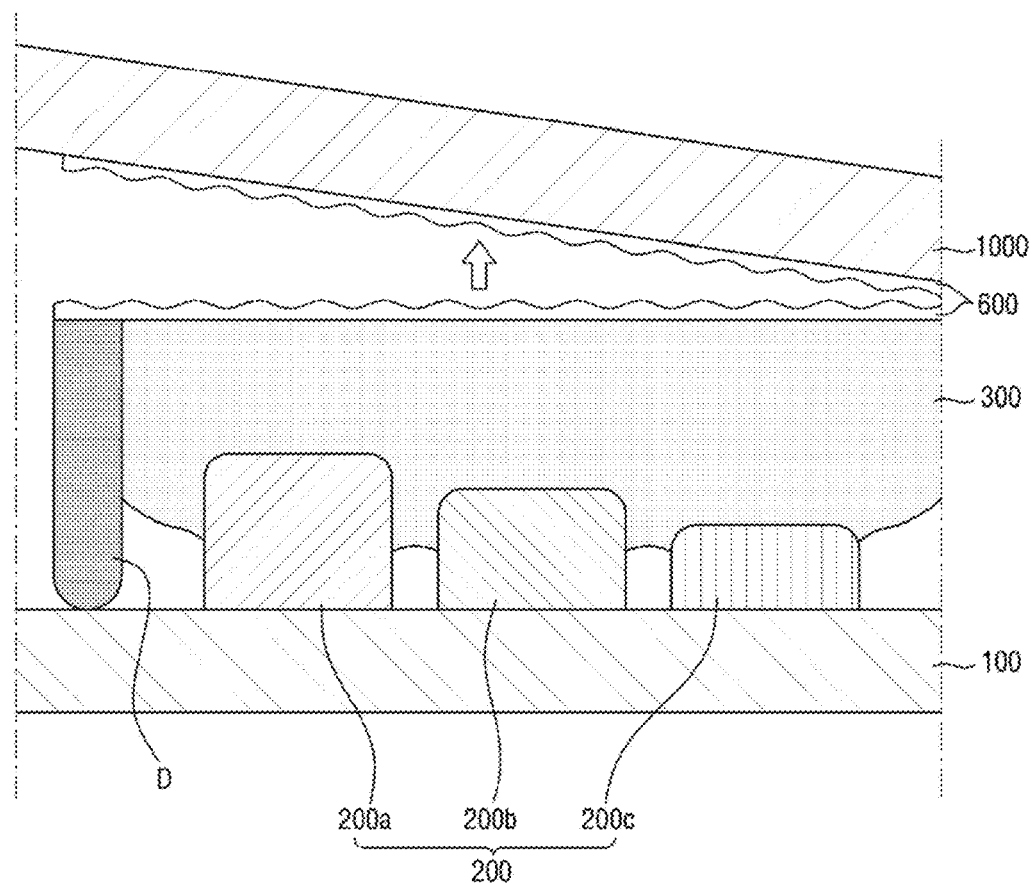

FIGS. 19 and 20 are sectional views of a method of manufacturing the color converter 5 shown in FIG. 8 according to some process steps. Hereinafter, the duplicate descriptions corresponding to the manufacturing method of FIGS. 9 to 14 will be omitted, and differences will be mainly described.

Referring to FIG. 19, when preparing a second attaching assembly 23, the surface of the sacrificial substrate 1000 is coated with a fluorinated material to form a fluorinated film 600, and then the dam member D and the overcoating material OCM are formed on the fluorinated film 600. The fluorinated film 600 may be formed to easily detach the sacrificial substrate 1000, and may be made of a material having a low surface energy to the overcoat layer 300 and the dam member D. The fluorinated film 600 may also have a low surface energy to the sacrificial substrate 1000.

A surface of the sacrificial substrate 1000 may also be directly fluorinated. In this case, an upper portion of the sacrificial substrate 1000 coated with the fluorinated material may be formed into the fluorinated film 600.

Referring to FIG. 20, when detaching the sacrificial substrate 1000, the fluorinated material constituting the fluorinated film 600 partially remains on the upper surface of the overcoat layer 300 and the upper surface of the dam member D to form the fluorinated film 600, thereby manufacturing the color converter 5 of FIG. 8. As described above, the fluorinated film 600 facilitates separation between the sacrificial substrate 1000 and the overcoat layer 300 and separation between the sacrificial substrate 1000 and the dam member D.

Since other process steps are substantially the same as those described above with reference to FIGS. 9 to 14, detailed description thereof will be omitted.

As described above, according to the embodiments of the present disclosure, there are at least the following effects.

In a color converter, a flatness of an upper surface of an overcoat layer covering a wavelength conversion pattern layer can be increased, and thus a defective rate of a polarizing element or the like can be reduced in a process of directly forming the polarizing element or the like.

The effects of the present disclosure are not limited by the foregoing, and other various effects are anticipated herein.

Although the preferred embodiments of the present disclosure have been disclosed for illustrative purposes, those skilled in the art will appreciate that various modifications, additions and substitutions are possible, without departing from the scope and spirit of the present disclosure as disclosed in the accompanying claims.

What is claimed is:

1. A color converter, comprising:
a base substrate;
a wavelength conversion pattern layer including a plurality of wavelength conversion layers disposed on the base substrate to be spaced apart from each other; and
an overcoat layer disposed on the wavelength conversion pattern layer to cover at least a part of the wavelength conversion pattern layer,
wherein the overcoat layer has an upper surface having a higher flatness than a lower surface, and
wherein there is no contact surface between the overcoat layer and the base substrate.

2. The color converter of claim 1,
wherein a space formed by air or vacuum and covered with the overcoat layer is defined between adjacent wavelength conversion layers of the plurality of wavelength conversion layers.

3. The color converter of claim 1,
wherein the upper surface of the overcoat layer has a flatness of 40 nm or less.

4. The color converter of claim 1, further comprising:
a dam member disposed on the base substrate and surrounding an edge of an area in which the wavelength conversion pattern layer and the overcoat layer are disposed.

5. The color converter of claim 1,
wherein the dam member has an upper surface having higher a flatness than a lower surface.

6. The color converter of claim 5, further comprising:
a function layer disposed to cover the upper surface of the overcoat layer and the upper surface of the dam member,
wherein a contact area between the dam member and the function layer is larger than a contact area between the dam member and the base substrate.

7. The color converter of claim 6,
wherein the function layer includes at least one of a polarizing element, an inorganic film, and an organic film.

8. The color converter of claim 1,
wherein the upper surface of the overcoat layer contains a material having a fluorine group.

9. The color converter of claim 1, further comprising:
a column spacer disposed on at least one of the plurality of wavelength conversion layers.

10. A color converter, comprising:
a base substrate;
a wavelength conversion pattern layer including a plurality of wavelength conversion layers disposed on the base substrate to be spaced apart from each other; and
an overcoat layer disposed on the wavelength conversion pattern layer to cover at least a part of the wavelength conversion pattern layer,
wherein a space formed by air or vacuum and covered with the overcoat layer is defined between adjacent wavelength conversion layers of the plurality of wavelength conversion layers.

11. The color converter of claim 10,
wherein the overcoat layer has an upper surface having a higher flatness than a lower surface.

12. The color converter of claim 11,
wherein the upper surface of the overcoat layer has a flatness of 40 nm or less.

13. The color converter of claim 10, further comprising:
a dam member disposed on the base substrate and surrounding an edge of an area in which the wavelength conversion pattern layer and the overcoat layer are disposed.

14. The color converter of claim 13,
wherein the dam member has an upper surface having a higher flatness than a lower surface.

15. The color converter of claim 14, further comprising:
a function layer disposed to cover the upper surface of the overcoat layer and the upper surface of the dam member,
wherein a contact area between the dam member and the function layer is larger than a contact area between the dam member and the base substrate.

16. The color converter of claim 1, wherein adjacent wavelength conversion layers of the plurality of wavelength conversion layers have different heights.

* * * * *